United States Patent
Tutt et al.

(10) Patent No.: US 8,698,230 B2
(45) Date of Patent: Apr. 15, 2014

(54) CIRCUIT INCLUDING VERTICAL TRANSISTORS WITH A CONDUCTIVE STACK HAVING REENTRANT PROFILE

(75) Inventors: Lee W. Tutt, Webster, NY (US); Shelby F. Nelson, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/401,958

(22) Filed: Feb. 22, 2012

(65) Prior Publication Data

US 2013/0214347 A1 Aug. 22, 2013

(51) Int. Cl.
  H01L 29/76 (2006.01)
  H01L 29/94 (2006.01)
  H01L 31/062 (2012.01)
  H01L 31/113 (2006.01)
  H01L 31/119 (2006.01)
  H01L 29/788 (2006.01)

(52) U.S. Cl.
  USPC .... 257/329; 257/288; 257/317; 257/E29.118; 257/E29.262; 257/E29274; 257/E29.313

(58) Field of Classification Search
  USPC ............ 257/317, 329, E29.118, E29.262, 257/E29.274, E29.313, 288
  See application file for complete search history.

(56) References Cited

U.S. PATENT DOCUMENTS

| | | | | |
|---|---|---|---|---|
| 4,997,778 A | * | 3/1991 | Sim et al. | 438/182 |
| 5,053,348 A | * | 10/1991 | Mishra et al. | 438/571 |
| 5,144,393 A | * | 9/1992 | Yamaguchi et al. | 257/327 |
| 5,498,560 A | * | 3/1996 | Sharma et al. | 438/261 |
| 6,204,133 B1 | * | 3/2001 | Yu et al. | 438/299 |
| 6,309,933 B1 | * | 10/2001 | Li et al. | 438/291 |
| 6,476,427 B2 | * | 11/2002 | Matsuda | 257/267 |
| 6,506,649 B2 | * | 1/2003 | Fung et al. | 438/300 |
| 7,256,430 B1 | * | 8/2007 | Horch | 257/163 |
| 7,413,982 B2 | | 8/2008 | Levy | 438/680 |
| 7,456,429 B2 | | 11/2008 | Levy | 257/66 |

(Continued)

FOREIGN PATENT DOCUMENTS

| | | |
|---|---|---|
| JP | 2-140863 | 11/1990 |
| JP | 2008 060522 | 3/2008 |
| JP | 2004 349292 | 7/2011 |
| WO | 2007/086237 | 8/2007 |

OTHER PUBLICATIONS

U.S. Appl. No. 13/218,482, filed Aug. 26, 2011, Nelson et al.
U.S. Appl. No. 12/986,241, filed Jan. 7, 2011, Tutt et al.

Primary Examiner — Ida M Soward
(74) Attorney, Agent, or Firm — William R. Zimmerli (57) ABSTRACT

An electrical circuit includes first and second transistors. Each transistor includes a substrate and, positioned thereon, a first electrically conductive material layer including a reentrant profile functioning as a gate. First and second discrete portions of a second electrically conductive material layer are in contact with first and second portions, respectively, of a semiconductor material layer in contact with an electrically insulating material layer, both of which conform to the reentrant profile. The first and second discrete portions are source/drain and drain/source electrodes of the first and second transistors, respectively. A third electrically conductive material layer, in contact with a third portion of the semiconductor material layer, is positioned over the gate, but is not in electrical contact with it. The third electrically conductive material layer is physically separate from the electrodes of the first and second transistors and a common unconnected electrode of the first and second transistors.

6 Claims, 6 Drawing Sheets

(56) References Cited

U.S. PATENT DOCUMENTS

| | | | |
|---|---|---|---|
| 7,473,947 B2 * | 1/2009 | Murthy et al. | 257/288 |
| 7,642,567 B2 * | 1/2010 | Amasuga et al. | 257/194 |
| 7,776,694 B2 * | 8/2010 | Jang et al. | 438/270 |
| 7,795,084 B2 * | 9/2010 | Jung | 438/197 |
| 7,923,313 B1 | 4/2011 | Tutt et al. | 438/156 |
| 7,985,684 B1 | 7/2011 | Tutt et al. | 438/699 |
| 7,985,986 B2 * | 7/2011 | Heikman et al. | 257/194 |
| 8,273,654 B1 * | 9/2012 | Nelson et al. | 438/627 |
| 2002/0086516 A1 * | 7/2002 | Hsu et al. | 438/617 |
| 2004/0115896 A1 * | 6/2004 | Bae et al. | 438/408 |
| 2004/0115908 A1 * | 6/2004 | Marsh et al. | 438/570 |
| 2004/0132236 A1 * | 7/2004 | Doris et al. | 438/182 |
| 2004/0157423 A1 * | 8/2004 | Behammer | 438/597 |
| 2007/0001239 A1 * | 1/2007 | Deleonibus | 257/408 |
| 2007/0173004 A1 * | 7/2007 | Hall et al. | 438/197 |
| 2009/0078966 A1 * | 3/2009 | Asai et al. | 257/194 |
| 2010/0301395 A1 * | 12/2010 | Xu et al. | 257/194 |
| 2011/0127545 A1 * | 6/2011 | Makiyama et al. | 257/77 |
| 2011/0291159 A1 * | 12/2011 | Shih et al. | 257/194 |
| 2012/0248416 A1 * | 10/2012 | Zhou et al. | 257/29 |

* cited by examiner

CIRCUIT INCLUDING VERTICAL TRANSISTORS WITH A CONDUCTIVE STACK HAVING REENTRANT PROFILE

CROSS REFERENCE TO RELATED APPLICATIONS

Reference is made to commonly-assigned, U.S. patent application Ser. No. 13/401,934, entitled "VERTICAL TRANSISTOR ACTUATION", filed concurrently herewith.

FIELD OF THE INVENTION

This invention relates generally to electrical circuits and, in particular, to electrical circuits including vertical transistors.

BACKGROUND OF THE INVENTION

In semiconductor processing technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. Typically, this type of relief includes surfaces which are inclined or vertical with respect to the substrate surface. As sizes of integrated circuits continue to shrink, it is becoming more and more necessary to pattern vertical or inclined device surfaces so as to functionally differentiate these devices over their vertical extent while still maintaining pattern alignment. Examples of these types of semiconductor devices include deep trench capacitors, stacked capacitors, and vertical transistors.

Currently, it is not possible to put patterns directly on walls which are vertical with respect to the substrate surface using conventional photolithographic techniques. Usually, vertical wall patterning of this nature is accomplished using a suitable filler material which, when partially filling in a trench, acts as a mask for the portions of the wall located underneath while allowing for processing of the walls above the filler material. For example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when an oxide is to be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

There are deposition processes which can be used to deposit thin films on vertical or inclined surfaces of a substrate relief. However, it is difficult to control the thickness of the layer deposited. Typically, the thickness of the coating decreases as the depth of the relief increases, for example, as the length of the vertical or inclined wall increases. As such, layers deposited using these types of deposition processes have considerable differences in thickness over the length of the relief. These types of deposition processes include plasma-enhanced chemical vapor deposition (PECVD) and diffusion-limited deposition of silicon oxide using tetraethyl orthosilicate (TEOS).

Vertical transistors are known. In one example of a vertical transistor, the gate region is moved vertically and one electrode of the source drain combination is located over the gate region while the second electrode of the drain source combination is located on a lower level of the vertical transistor adjacent to the gate region. While this approach works extremely well for its intended purpose, there remains an opportunity to improve aspects of the vertical transistor. For example, it is necessary to contact the electrodes of the vertical transistor on two different planes. This makes interconnecting the electrodes of multiple vertical transistors in a circuit more difficult. Conventional methods of interconnecting electrodes located at different heights tend to be complicated and prone to failure. In another example, the two electrodes used as the drain and the source do not respond or act symmetrically due to an inherent asymmetry at the edge of the vertical transistor. As such, vertical transistor performance often depends on which electrode is used as the drain and which electrode is used as the source.

As such, there is an ongoing need to provide semiconductor devices including vertical transistors having improved uniform performance characteristics. There is also an ongoing need to interconnect transistors in a less complex and more reliable manner.

SUMMARY OF THE INVENTION

According to an aspect of the present invention, an electrical circuit includes a first transistor and a second transistor. Each of the first transistor and the second transistor include a substrate and a first electrically conductive material layer stack positioned on the substrate. The first electrically conductive material layer stack includes a reentrant profile and functions as a gate. An electrically insulating material layer conforms to the reentrant profile of the first electrically conductive material layer stack and is in contact with at least a portion of the substrate. A semiconductor material layer conforms to the reentrant profile, and is in contact with the electrically insulating material layer. A first discrete portion of a second electrically conductive material layer is in contact with a first portion of the semiconductor material layer. The first discrete portion of the second electrically conductive material layer is a source/drain electrode of the first transistor. A second discrete portion of the second electrically conductive material layer is in contact with a second portion of the semiconductor material layer. The second discrete portion of the second electrically conductive material layer is a drain/source electrode of the second transistor. A third electrically conductive material layer is in contact with a third portion of the semiconductor material layer. The third electrically conductive material layer is positioned over the gate but is not in electrical contact with the gate. The third electrically conductive material layer is physically separate from the source/drain electrode of the first transistor and physically separate from the drain/source electrode of the second transistor. The third electrically conductive material layer is a common unconnected electrode of the first transistor and the second transistor.

BRIEF DESCRIPTION OF THE DRAWINGS

In the detailed description of the example embodiments of the invention presented below, reference is made to the accompanying drawings, in which.

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art. In the following description and drawings, identical reference numerals have been used, where possible, to designate identical elements.

The example embodiments of the present invention are illustrated schematically and not to scale for the sake of clarity. One of the ordinary skills in the art will be able to readily determine the specific size and interconnections of the elements of the example embodiments of the present invention.

Figure 1:
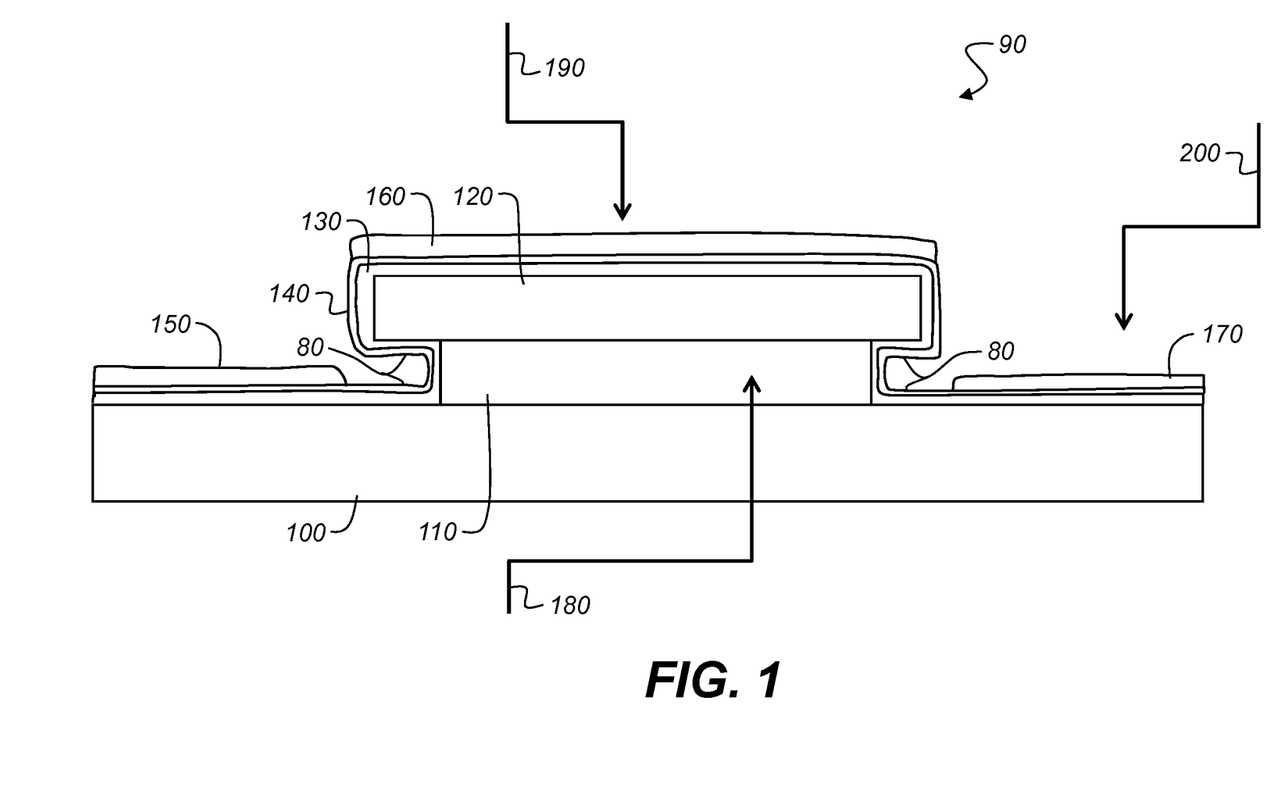
FIG. 1 is a schematic cross sectional view a reentrant profile vertical transistor device including the locations of typical electrical connections.

Referring to FIG. 1, an example embodiment of a vertical transistors 90, shown in cross section, which is included in the electrical circuit of the present invention or included in the semiconductor device actuation method of the present invention is shown. Vertical transistors 90 include a reentrant profile 80. A substrate 100 can be any material or combination of materials as long as it fulfills the function of holding or supporting the layers on it and not acting as a short site for the gate and source/drain electrodes. Onto this substrate 100, an electrically conductive gate 110 is patterned with an appropriate thickness for the desired gate length of the vertical transistors 90. The gate 110 is conductive to allow the fields to be generated which allow the transistors 90 to actuate. Reentrant profile 80 is created by material layer 120 that is located on or above the electrically conductive gate 110 and is preferably a conductive material. Its main function, however, is to provide an overhang to shadow a portion of the substrate 100 and any intervening layers (layer 110, for example) underneath the overhang. Conductive gate 100 and material layer 120 form a first electrically conductive material layer stack in this example embodiment of vertical transistors 90.

The coatings of dielectric material 130 and semiconductor material 140 are conformal and therefore portions of both are shadowed when an electrically conducting material layer or layers (forming electrodes 150, 160, and 170) are deposited by a directional (for example, an anisotropic) deposition process such as thermal evaporation or sputtering. Typically, electrodes 150, 160, and 170 are discrete portions of the same material layer. Electrode 160 is physically separated from electrodes 150 and 170 due to its position on the first electrically conductive material layer stack.

FIG. 1 also shows where conventional electrical connections are made to the different electrically conductive materials. The gate electrical connection 180 is connected to the electrically conductive gate 110. The source or drain electrical connection 190 is connected to the electrically conducting electrode 160 and the other connection, the drain or source electrical connection 200, is connected to the electrically conducting electrode 170. This yields the three necessary connections for a standard transistor. The other electrically conducting electrode 150 is left unconnected. One should realize that, due to the symmetry, either electrically conducting electrode 150 or 170 can be used interchangeably as the drain or source electrical connection 200, with the other left unconnected.

Figure 2:
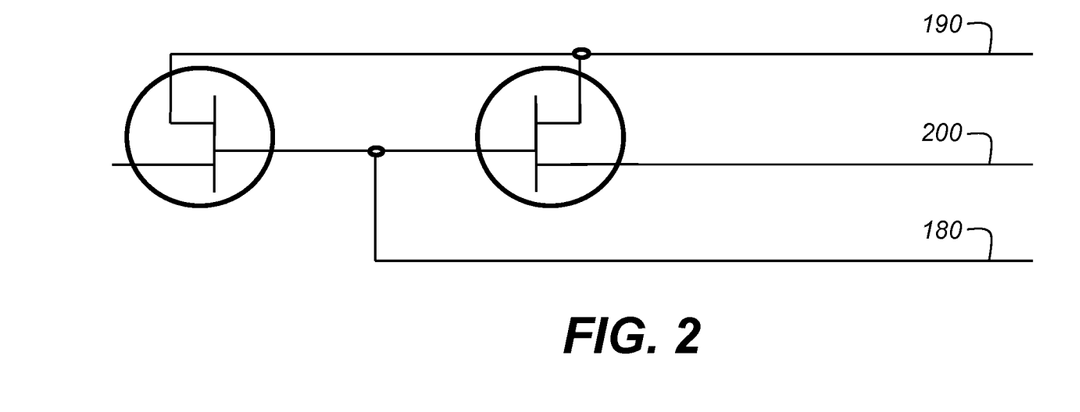
FIG. 2 is an electrical schematic diagram of two of the devices shown in FIG. 1.

FIG. 2 shows an electrical schematic diagram of the vertical transistors shown in FIG. 1 using conventional electrical connections. While it is useful to connect these transistors into a circuit in the standard way, it requires one to attach an electrical connection to the electrode 160 on top of the vertical transistors. This not only adds height, but may also decrease the robustness of the vertical transistors because the materials of the gate may not be as flexible as the material of the support. Furthermore, the complexity of the electrical connects is increased because special interconnect circuitry is often used to connect the top of the transistor to the surrounding substrate plane. Also, the overhang of the reentrant profile might not be symmetric with the bottom of the transistors leading to an asymmetry in the electrical response of the transistors formed on either side of the gate.

Figure 3:
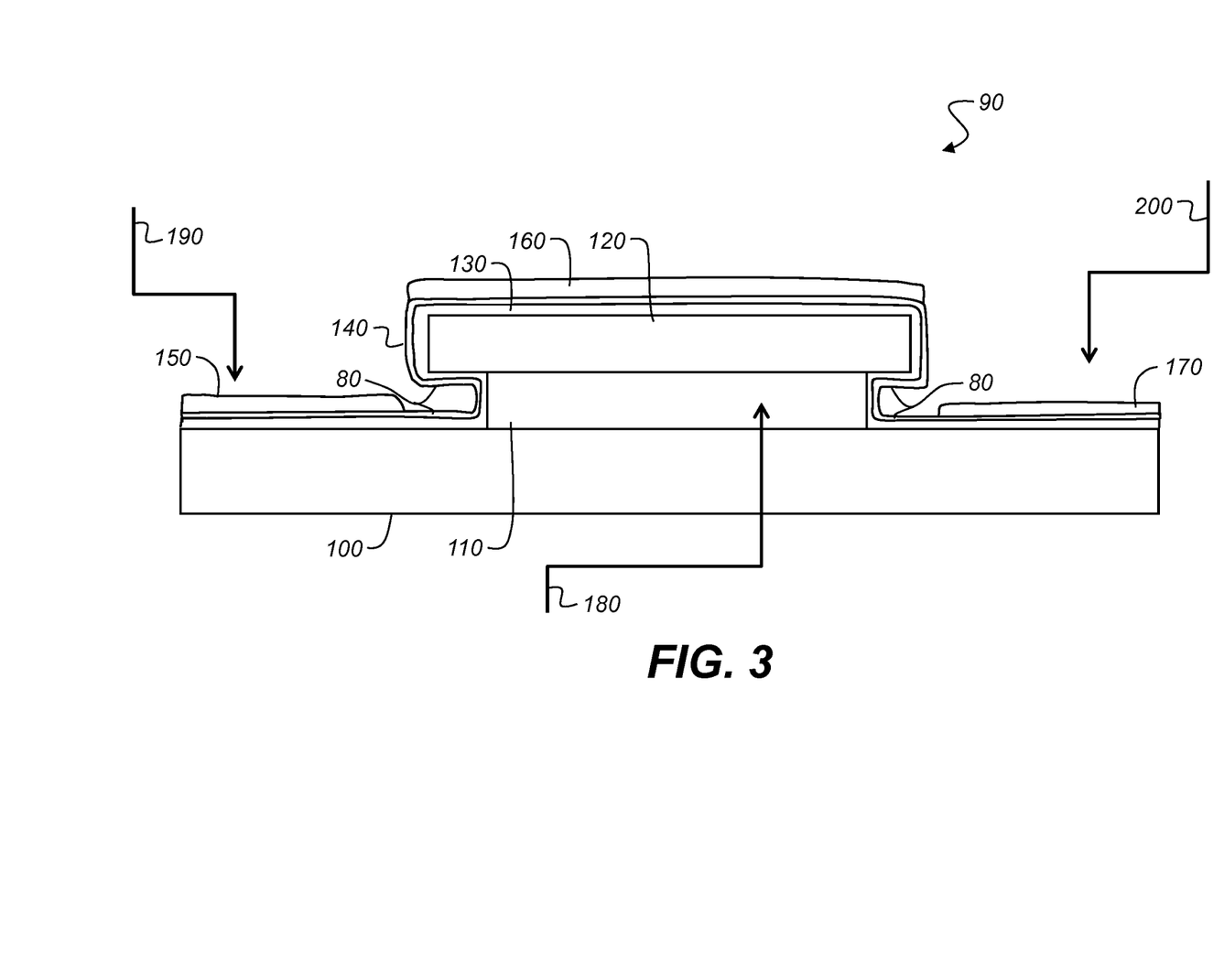
FIG. 3 is a schematic cross sectional view of a reentrant profile vertical transistor device including the locations of electrical connections according to an example embodiment of the invention.

Referring to FIG. 3, an example embodiment of the vertical transistors of FIG. 1 is shown in cross section and includes the electrical connections that facilitate the present inventions. The material layers of the vertical transistors 90 shown in FIG. 3 are the same as those shown FIG. 1. The electrical connections 180, 190, 200, however, are different. In FIG. 3, electrical connection 190 is connected to the symmetric electrically conducting electrode 150. There is no electrical connection made to the electrically conducting electrode 160 located above the electrically conductive gate 110.

Additional example embodiments of vertical transistors that can be included in the circuit of the present invention or in the actuation method of the present invention include, for example, U.S. Pat. No. 7,985,684 B1, issued to Tutt et al., on Jul. 26, 2011; U.S. Pat. No. 7,923,313 B1, issued to Tutt et al., on Apr. 12, 2011; U.S. patent application Ser. No. 13/218,482, filed by Nelson and Tutt, on Aug. 26, 2011; and U.S. patent application Ser. No. 12/986,241, filed by Tutt and Nelson, on Jan. 7, 2011, the disclosures of which are incorporated herein in their entirety. For example, in some embodiments of the present invention, the electrically insulating material layer is a first electrically insulating material layer and vertical transistors 90 include a second electrically insulating material layer positioned in between the first electrically conductive material layer stack and the third electrically conductive material layer. In other example embodiments of the invention, the first electrically conductive material layer stack includes a single material layer with the reentrant profile in the single material layer. In another example embodiment of the invention, the first electrically conductive material layer stack includes a plurality of material layers with the reentrant profile being in one or a combination of the plurality of material layers.

When the vertical transistor includes a second electrically insulating material layer positioned in between the first electrically conductive material layer stack and the third electrically conductive material layer, typically, the second electrically insulating material layer is a low k dielectric material layer. The low k dielectric material layer can include an organic material, for example, one of a photoresist and a polymer. In some example embodiments, when the second electrically insulating material layer is a low k dielectric material layer, the first electrically insulating material layer can be a high k dielectric material layer.

Actuation of a semiconductor device is accomplished by providing a vertical transistors 90 as shown in FIG. 3. A voltage is applied between the first discrete portion of the second electrically conductive material layer (for example, electrode 150) and the second discrete portion of the second electrically conductive material layer (for example, electrode 170). A voltage is applied to the first electrically conductive material layer stack (for example, gate 110 and material layer 120) to modulate a resistance between the first discrete portion of the second electrically conductive material layer and the second discrete portion of the second electrically conductive material layer.

Figure 4:
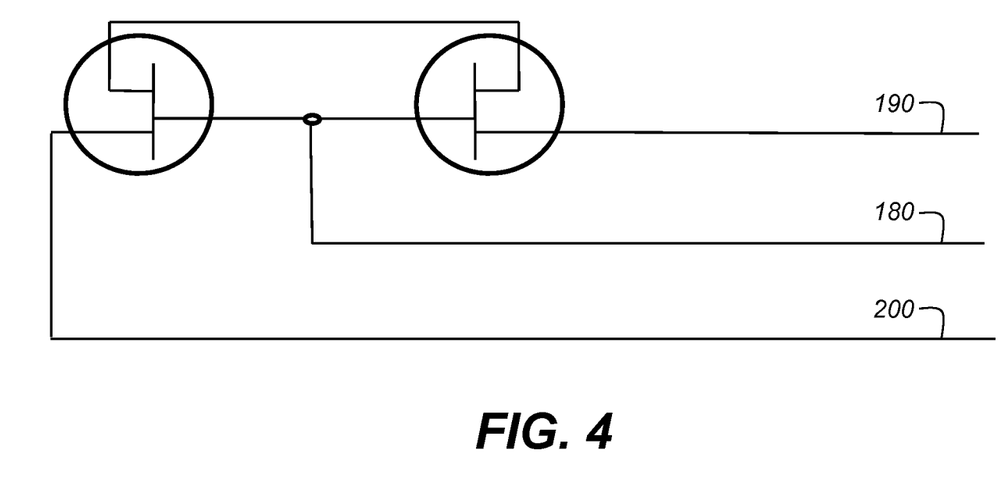
FIG. 4 is an electrical schematic diagram of two of the devices shown in FIG. 3.
Figure 5A:
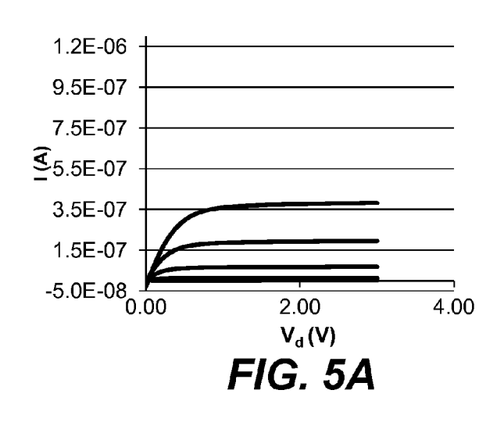
FIGS. 5A and 5C are graphs showing performance Id-Vd curve characteristics for the vertical transistor shown in FIG. 1 for two source drain connections shown in FIGS. 5B and 5D, respectively, the curves representing increasing gate voltage in 0.25 Volt increments.
Figure 5B:
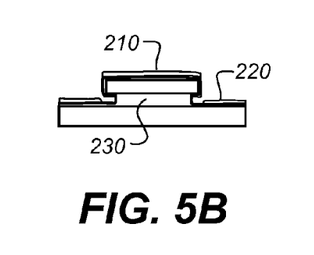
Figure 5C:
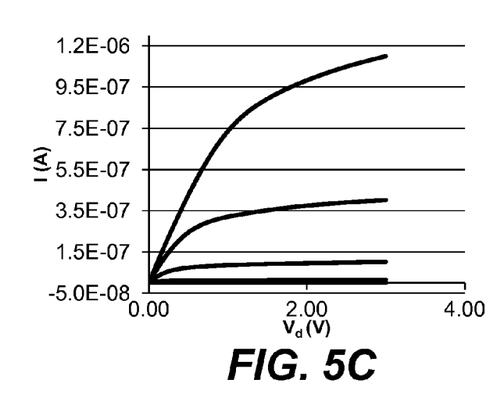
Figure 5D:
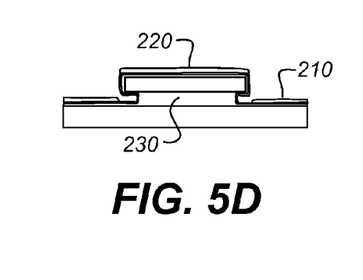
Figure 6A:
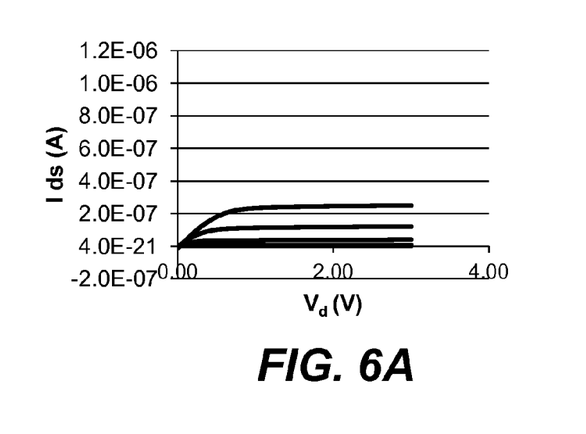
FIGS. 6A and 6C are graphs showing performance Id-Vd curve characteristics for the vertical transistor shown in FIG. 3 for two source drain connections shown in FIGS. 6B and 6D, respectively, the curves representing increasing gate voltage in 0.25 Volt increments.
Figure 6B:
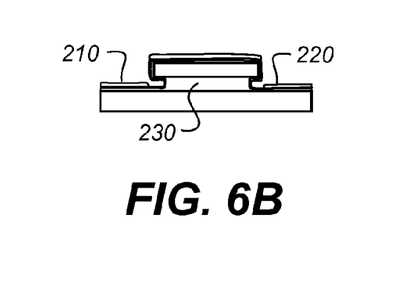
Figure 6C:
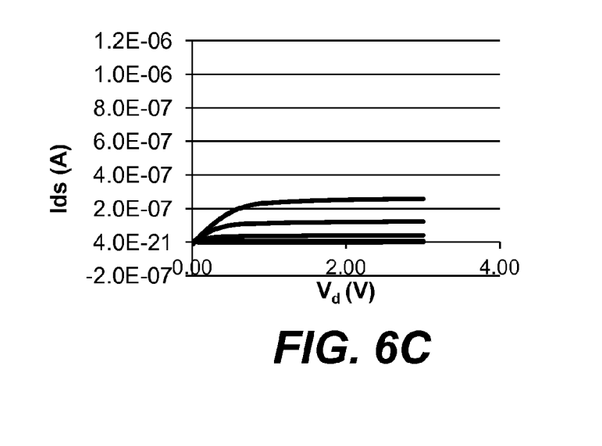
Figure 6D:
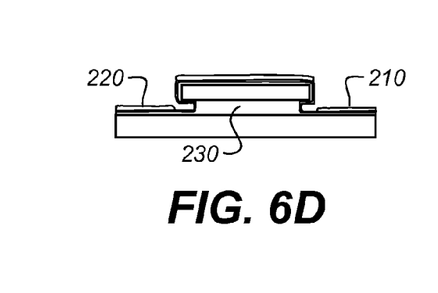

Referring to FIG. 4, an electrical schematic diagram of a double transistor configuration including the vertical transistors shown in FIG. 3 using the electrical connections shown in FIG. 3 to connect the vertical transistors into a circuit is shown. As shown in FIG. 4, the two transistors have a common unconnected electrode and the gates are tied together and simultaneously energized by the gate electrical connection 180. The drain and source electrodes are symmetric and therefore the source (or drain) electrical connection 190 and drain (or source) electrical connection 200 can be interchanged in the circuit. The first and second transistors are electrically connected on a single plane which helps to reduce the electrical wiring needed for the circuit while maintaining performance uniformity of the transistors.

Experimental Results

To show the utility of this approach, vertical transistors were made and the connection made using the following process.

A layer of 590 nm of molybdenum was deposited via sputtering on a 62.5 mm square glass substrate. On top of this, a 120 nm conductive aluminum zinc oxide (AZO) layer using the S-ALD process described in U.S. Pat. No. 7,413,982 and the S-ALD apparatus described in U.S. Pat. No. 7,456,429 with the organo-metallic precursors dimethylaluminum isopropoxide, diethyl zinc and an oxygen source of water with an inert carrier gas of nitrogen.

A patterned layer of photoresist was formed by spin coating at 3000 rpm Microposit S1813 resist (Rohm and Haas Electronic Materials LLC, Marlborough, Mass.) placed on a hot plate for 60 sec at 110 degrees Celsius and then exposed through a glass/chromium contact mask including lines for 60 seconds on a Cobilt mask aligner (Cobilt model CA-419 from Computervision Corporation, Sunnyvale, Calif.) The sample was then developed for 60 seconds in Microposit MF-319 developer (Rohm and Haas Electronic Materials LLC, Marlborough, Mass.) and rinsed for 1 minute in DI water.

The AZO layer was etched in dilute nitric acid for 35 seconds, leaving AZO under the photoresist lines. The conductive molybdenum was then plasma etched with 0.3 torr $SF_6$ at 200 W for 7 minutes using a PEII-A plasma etcher (Technics West Inc.). The photoresist was removed with acetone, then rinsed in HPLC grade isopropanol, and allowed to dry.

The substrate was then coated with a layer 15 nm thick of aluminum oxide conformally using the S-ALD process at 200 degrees Celsius with the organo-metallic precursors trimethyl aluminum and water with an inert carrier gas of nitrogen.

The substrate was then coated with a 12 nm layer of zinc oxide again using the S-ALD process at 200 degrees Celsius using the precursors diethyl zinc and water and nitrogen as the carrier gas.

The electrodes were applied by evaporation. Aluminum, about 70 nm thick, was evaporated through a shadow mask consisting of rectangular holes which run perpendicular to and completely cross each line on the substrate.

Testing of the transistor was accomplished by using a probe station to contact the aluminum on top of the molybdenum gate lines, the aluminum on one or both sides of the line and the molybdenum metal which acts as the gate.

Referring to FIGS. 5A-5D, measurements were taken on a vertical transistor including the electrical connections shown in FIG. 1. The current versus voltage of the two configurations of connecting the source electrode 210 above the gate electrode 230 (FIG. 5B) or beside it (FIG. 5D), with the drain electrode 220 in the other location, were measured and are plotted in FIGS. 5A and 5C, respectively. It can be clearly seen that there is an asymmetry between the electrical results of the two different electrical connections.

Referring to FIGS. 6A-6D, measurements were taken on a vertical transistor including the electrical connections of the present invention and shown in FIG. 3. The current versus voltage of two configurations of connecting the source electrode 210 on one side of the gate electrode 230 (FIG. 6B) or the other side (FIG. 6D), with the drain electrode 220 in the other location, were measured and are plotted in FIGS. 6A and 6C, respectively. It can be clearly seen that the symmetry of the two connections yields a virtually identical current voltage response. The current carrying capacity is slightly reduced, relative to the control connections, but that can be correspondingly modified by making a shorter channel length to give the desired current capacity. It should also be noted that a short circuit across one of the transistors, while changing the circuit response, does not cause a failure. The circuit is now also more robust because the connections are now all on the same plane allowing less complex circuit interconnection.

The invention has been described in detail with particular reference to certain preferred embodiments thereof, but it will be understood that variations and modifications can be effected within the scope of the invention.

PARTS LIST

80 Reentrant profile
90 Vertical transistors
100 Substrate
110 Electrically conductive gate
120 Reentrant profile material
130 Dielectric material
140 Semiconducting material
150 Electrically conducting electrode
160 Electrically conducting electrode
170 Electrically conducting electrode
180 Gate electrical connection
190 Source or drain electrical connection
200 Drain or source electrical connection
210 Source electrode
220 Drain electrode
230 Gate electrode

The invention claimed is:

1. An electrical circuit comprising:
a first transistor and a second transistor, each of the first transistor and the second transistor including:
a substrate;
an first electrically conductive material layer stack positioned on the substrate, the first electrically conductive material layer stack including a reentrant profile, the first electrically conductive material layer stack being a gate;
an electrically insulating material layer that conforms to the reentrant profile of the first electrically conductive material layer stack, and is in contact with at least a portion of the substrate;
a semiconductor material layer that conforms to the reentrant profile, and is in contact with the electrically insulating material layer;
a second electrically conductive material layer, a first discrete portion of the second electrically conductive material layer in contact with a first portion of the semiconductor material layer, the first discrete portion of the second electrically conductive material layer being a source/drain electrode of the first transistor, a second discrete portion of the second electrically conductive material layer in contact with a second portion of the semiconductor material layer, the second discrete portion of the second electrically conductive material layer being a drain/source electrode of the second transistor; and
a third electrically conductive material layer in contact with a third portion of the semiconductor material layer, the third electrically conductive material layer being positioned over the gate but not in electrical contact with the gate, the third electrically conductive material layer being physically separate from the source/drain electrode of the first transistor and physically separate from the drain/source electrode of the second transistor;
wherein the third electrically conductive material layer is a common unconnected electrode of the first transistor and the second transistor.

2. The circuit of claim 1, the electrically insulating material layer being a first electrically insulating material layer, the first transistor and the second transistor further comprising:
a second electrically insulating material layer positioned in between the first electrically conductive material layer stack and the third electrically conductive material layer.

3. The circuit of claim 2, wherein the second electrically insulating material layer is a low k dielectric material layer.

4. The circuit of claim 3, wherein the low k dielectric material layer includes an organic material.

5. The circuit of claim 4, wherein the organic material includes one of a photoresist and a polymer.

6. The circuit of claim 3, wherein the first electrically insulating material layer is a high k dielectric material layer.

* * * * *